(12) United States Patent
Gong et al.

(10) Patent No.: US 10,811,446 B2
(45) Date of Patent: Oct. 20, 2020

(54) ARRAY SUBSTRATE AND MANUFACTURING METHOD THEREFOR, DISPLAY PANEL, DISPLAY DEVICE

(71) Applicants: Hefei BOE Optoelectronics Technology Co., Ltd., Anhui (CN); BOE Technology Group Co., Ltd., Beijing (CN)

(72) Inventors: Kui Gong, Beijing (CN); Xianxue Duan, Beijing (CN); Myoung Kee Baek, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/317,644

(22) PCT Filed: May 10, 2018

(86) PCT No.: PCT/CN2018/086382
§ 371 (c)(1),
(2) Date: Jan. 14, 2019

(87) PCT Pub. No.: WO2018/228097
PCT Pub. Date: Dec. 20, 2018

(65) Prior Publication Data
US 2019/0288017 A1  Sep. 19, 2019

(30) Foreign Application Priority Data
Jun. 12, 2017 (CN) .......................... 2017 1 0437796

(51) Int. Cl.
*H01L 27/12* (2006.01)
*G02F 1/1362* (2006.01)

(52) U.S. Cl.
CPC .... *H01L 27/1296* (2013.01); *G02F 1/136227* (2013.01); *G02F 1/136277* (2013.01);
(Continued)

(58) Field of Classification Search
CPC ............. H01L 27/1296; H01L 27/1262; H01L 27/1214
See application file for complete search history.

(56) References Cited

U.S. PATENT DOCUMENTS

2011/0215330 A1* 9/2011 Shin .................... H01L 51/5218
257/59
2012/0235175 A1 9/2012 Pruhinskiy et al.
(Continued)

FOREIGN PATENT DOCUMENTS

CN 103985717 A 8/2014
CN 104637970 A 5/2015
(Continued)

OTHER PUBLICATIONS

Chinese Office Action for counterpart 201710437796.0 dated Apr. 30, 2019.
Search Report for PCT/CN2018/086382 dated Jul. 26, 2018.

*Primary Examiner* — Julia Slutsker
(74) *Attorney, Agent, or Firm* — Arent Fox LLP; Michael Fainberg

(57) ABSTRACT

Disclosed are an array substrate and a manufacturing method therefor, a display panel and a display device, which are used for enabling a viewer to see a uniform reflective effect at various viewing angles, improving the display effect. The array substrate manufacturing method comprises: sequentially forming, on a passivation layer, a reflective layer and a transparent conductive layer, the reflective layer being electrically connected, by means of a via hole penetrating through the passivation layer, to a source electrode or a drain electrode of the thin film transistor, and the (Continued)

transparent conductive layer comprising several metal ions; performing reduction process on the transparent conductive layer, so that the metal ions are reduced, and a metal particle layer is formed; and performing patterning process on the transparent conductive layer and the reflective layer on which the steps above are completed, so as to form a pixel electrode.

4 Claims, 4 Drawing Sheets

(52) U.S. Cl.
CPC ...... *H01L 27/1218* (2013.01); *H01L 27/1262* (2013.01); *H01L 27/1214* (2013.01)

(56) References Cited

U.S. PATENT DOCUMENTS

| | | | |
|---|---|---|---|
| 2015/0214254 A1* | 7/2015 | Yan | H01L 29/41733 257/72 |
| 2015/0372011 A1 | 12/2015 | Zhang et al. | |
| 2016/0380022 A1* | 12/2016 | Shu | H01L 27/14685 378/98.8 |

FOREIGN PATENT DOCUMENTS

| | | |
|---|---|---|
| CN | 105280682 A | 1/2017 |
| CN | 107170761 A | 9/2017 |

* cited by examiner

ARRAY SUBSTRATE AND MANUFACTURING METHOD THEREFOR, DISPLAY PANEL, DISPLAY DEVICE

This application is a National Stage of International Application No. PCT/CN2018/086382, filed May 10, 2018, which claims priority to the Chinese Patent Application No. 201710437796.0, submitted on Jun. 12, 2017 to the Chinese Patent Office and entitled "Array Substrate and Fabrication Method thereof, Display Panel and Display Device", which is hereby incorporated by reference in its entirety.

FIELD

The disclosure relates to the technical field of display, and in particular to an array substrate and a fabrication method thereof, a display panel and a display device.

BACKGROUND

Existing display devices include transmissive display devices, reflective display devices and transflective display devices. The transmissive display device mainly uses a backlight as its light source, that is, it is needed to arrange a backlight on the display panel of the transmissive display device for providing the light source for the display panel. But nevertheless, the backlight availability is not high enough and the luminance of the backlight needs to be enhanced in a large scale to improve the display luminance, and for this reason, the power consumption is high. Whereas the reflective display device mainly uses a front light or an external light as the light source, that is, there is no need to arrange the backlight behind the display panel of the reflective display device, and it mainly uses an external light to provide light source for the display panel, and its power consumption is relatively low.

SUMMARY

The embodiment of the disclosure provides an array substrate and a fabrication method thereof, a display panel and a display device. The specific schemes are as follows.

The embodiments of the disclosure provide a fabrication method of the array substrate. The fabrication method includes a method of fabricating a thin-film transistor and a passivation layer successively on a base substrate. The fabrication method further includes: forming a reflection layer and a transparent conduction layer successively on the passivation layer, wherein the reflection layer is electrically connected to a source or drain of the thin-film transistor through a via hole penetrating through the passivation layer, and the transparent conduction layer contains a plurality of metal ions; performing a reduction processing on the transparent conduction layer to enable the metal ions to be reduced to form a metallic particle layer; and patterning the transparent conduction layer and the reflection layer on which the above steps have been completed to form a pixel electrode.

Optionally, the step of performing the reduction processing on the transparent conduction layer to enable the metal ions to be reduced to form a metallic particle layer includes: performing plasma processing on the transparent conduction layer in the working environment of reducing gas to enable the metal ions contained in the transparent conduction layer to be reduced to form a metallic particle layer.

Optionally, the reducing gas is any one of hydrogen, chlorine, carbon monoxide, hydrogen sulfide, hydrogen bromide, methane and sulfur dioxide.

Optionally, a thickness of the metallic particle layer is $1/10$-$1/5$ of a thickness of the transparent conduction layer.

Optionally, the step of forming a reflection layer and a transparent conduction layer successively on the passivation layer includes: depositing a metal layer and a transparent conduction layer successively on the passivation layer by magnetron sputtering.

Optionally, the transparent conduction layer is any one or any combination of indium tin oxide, indium zinc oxide and zinc oxide.

The embodiment of the disclosure further provides an array substrate fabricated by the above fabrication method. The array substrate includes a thin-film transistor and a passivation layer located successively on a base substrate, and further includes a reflection layer located on the passivation layer and a transparent conduction layer located on the reflection layer; and the transparent conduction layer includes a metallic particle layer formed by a plurality of metallic particles.

Optionally, a thickness of the metallic particle layer is $1/10$-$1/5$ of a thickness of the transparent conduction layer.

The embodiment of the disclosure also provides a display panel including the array substrate above.

The embodiment of the disclosure also provides a display device including the display panel above.

DETAILED DESCRIPTION

Figure 1:
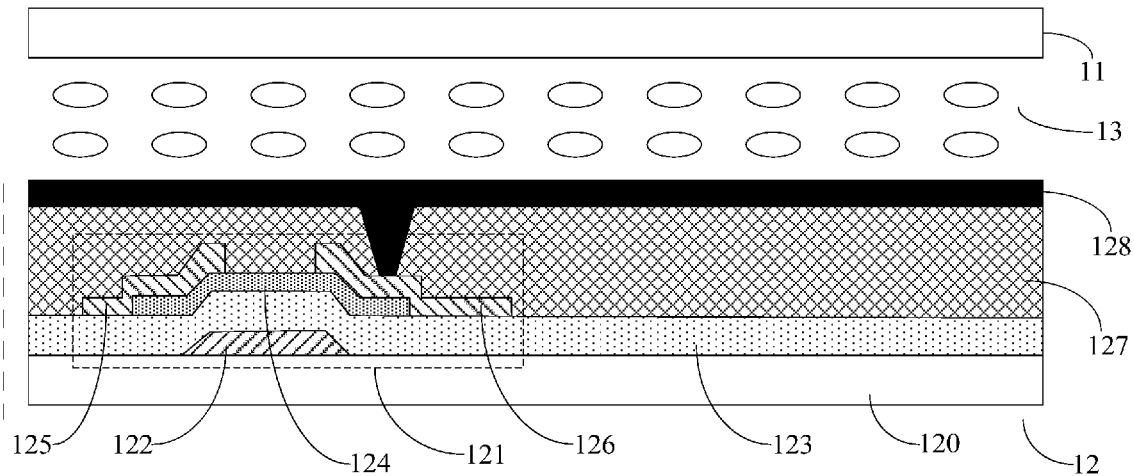
FIG. 1 is a schematic structural diagram of a reflective display panel in the prior art.

A display panel of the reflective display device in the related art is shown in FIG. 1. The display panel is formed by performing cell process on an opposite substrate 11 and an array substrate 12, and a liquid crystal layer 13 is packaged in a space between the opposite substrate 11 and the array substrate 12. The array substrate 12 includes a thin-film transistor 121 located on a base substrate 120, a passivation layer 127 located on the thin-film transistor 121, and a pixel electrode 128 located on the passivation layer 127, and a metal electrode capable of reflecting light is adopted as the pixel electrode 128. The thin-film transistor 121 includes a gate 122, a gate insulating layer 123, a semiconductor active layer 124, a source 125 and a drain 126.

However, the light reflected by the pixel electrode included in the display panel of the reflective display device has a certain direction, and the pixel electrode cannot enable the viewer to see a uniform reflecting effect at all angles of view.

In view of this, the embodiments of the disclosure provide an array substrate and a fabrication method thereof, a display panel and a display device, to enable the viewer to see a uniform reflecting effect at all angles of view and improve the display effect.

In order to make the objects, technical solutions and advantages of the disclosure more apparent, the disclosure is further described in detail below with reference to the appended drawings. It is apparent that the embodiments described are only part, not all of embodiments of the disclosure. Based upon the embodiments here of the disclosure, all other embodiments which can occur to those ordinarily skilled in the art without any inventive effort shall fall into the claimed scope of the disclosure.

Figure 2:
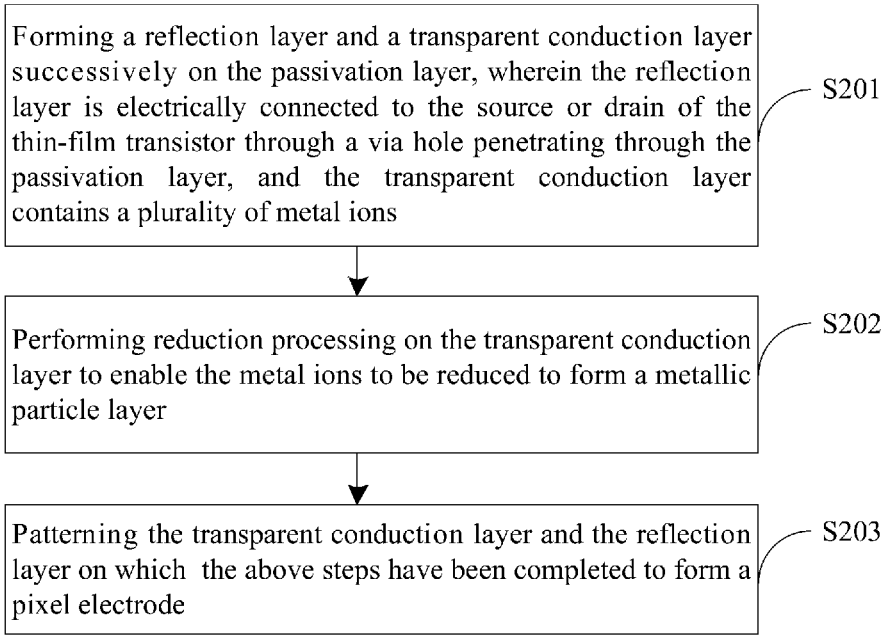
FIG. 2 is a flow chart of a fabrication method of an array substrate in accordance with the embodiment of the disclosure.

As shown in FIG. 2, the embodiment of the disclosure provides a fabrication method of the array substrate, including a method of fabricating a thin-film transistor and a passivation layer successively on a base substrate, the fabrication method further includes the following steps.

S201 is to form a reflection layer and a transparent conduction layer successively on the passivation layer, wherein the reflection layer is electrically connected to the source or drain of the thin-film transistor through a via hole penetrating through the passivation layer, and the transparent conduction layer contains a plurality of metal ions.

S202 is to perform reduction processing on the transparent conduction layer to enable the metal ions to be reduced to form a metallic particle layer.

S203 is to pattern the transparent conduction layer and the reflection layer which have completed the above steps to form a pixel electrode.

The pixel electrode formed by the embodiment of the disclosure includes a reflection layer and a transparent conduction layer. The reflection layer can reflect external light well and functions as a reflective array substrate. Meanwhile, due to the reduction processing performed on the transparent conduction layer in the embodiment of the disclosure, a metallic particle layer is formed, which, in turn, can have a good diffuse reflection effect on the light irradiated to the transparent conduction layer. Therefore, the embodiment of the disclosure enables the viewer to see a uniform reflecting effect at all angles of view, and improves the display effect compared with the prior art.

Specifically, the fabrication of the thin-film transistor on the base substrate in the embodiment of the disclosure includes: fabricating a gate, a gate insulating layer, a semiconductor active layer, a source and a drain successively on the base substrate by patterning processes; or fabricating a light shielding layer, a first insulating layer, a semiconductor active layer, a gate insulating layer, a gate, a second insulating layer, a source and a drain successively on the base substrate by the patterning processes.

The patterning process in the embodiment of the disclosure includes part or all of the processes of coating, exposing, developing, etching and removing of photoresist. The method for fabricating the thin-film transistor in the embodiment of the disclosure is similar to the prior art, which will not be described again herein. In the actual production process, the fabricated thin-film transistor can be either a bottom gate thin-film transistor or a top-gate thin-film transistor, or thin-film transistors of other types. The embodiment of the disclosure will not limit the type of the thin-film transistor.

After that, a passivation layer is fabricated on the thin-film transistor by the patterning process in the embodiment of the disclosure. The fabrication method of the passivation layer is similar to that of the prior art, which will not be described again herein. The selection of the material of the passivation layer is the same as that of the prior art, which will not be described again herein.

Then a reflection layer and a transparent conduction layer are formed successively on the passivation layer. Specifically a metal layer and a transparent conduction layer are deposited successively on the passivation layer by magnetron sputtering. It is understood that, in the actual production process, the metal layer and the transparent conduction layer can be deposited by other methods, for example, a metal layer and a transparent conduction layer can be successively deposited by thermal evaporation.

Optionally, the material of the metal layer in the embodiment of the disclosure may be selected from any one or any combination of molybdenum (Mo), aluminum (Al), copper (Cu), silver (Ag), etc. The material of the transparent conduction layer in the embodiment of the disclosure may be selected from any one or any combination of indium tin oxide (ITO), indium zinc oxide (IZO) and zinc oxide (ZnO). It is understood that, in the actual production process, the material of the transparent conduction layer in the embodiment of the disclosure may also be selected from other transparent conduction materials containing a plurality of metal ions. The embodiment of the disclosure does not limit the specific material of the transparent conduction layer.

Then reduction processing is performed on the transparent conduction layer, so that the metal ions contained in the transparent conduction layer are reduced to form a metallic particle layer. Specifically, in the working environment of the reducing gas, plasma processing is performed on the transparent conduction layer, so that the metal ions contained in the transparent conduction layer are reduced to form a metallic particle layer. Due to the fact that the plasma processing is mature so far, the transparent conduction layer is processed by the plasma processing, which can ensure the stability of the process and the yield rate of the processing result. In this way, in the working environment of the reducing gas, the metal ions contained in the transparent conduction layer can be well reduced by plasma processing.

Optionally the reducing gas in the embodiment of the disclosure is any one of hydrogen ($H_2$), chlorine ($Cl_2$), carbon monoxide (CO), hydrogen sulfide ($H_2S$), hydrogen bromide (HBr), methane ($CH_4$) and sulfur dioxide ($SO_2$).

Optionally the thickness of the metallic particle layer formed in the embodiment of the disclosure is $\frac{1}{10}$-$\frac{1}{5}$ of the thickness of the transparent conduction layer. If the thickness of the metallic particle layer formed in the embodiment of the disclosure is relatively thin, the metallic particle layer cannot play a good role in diffuse reflection; and in case that the thickness of the formed metallic particle layer is relatively thick, the metallic particle layer can affect the light reflecting property of the reflection layer in the embodiment of the disclosure.

The fabrication method of the array substrate according to the embodiment of the disclosure is described in detail below with reference to a specific embodiment.

The thicknesses, regional sizes and shapes of various layers in the drawings do not reflect the true proportion of the layers with the purpose of illustrating the disclosure only.

The thin-film transistor formed in the embodiment of the disclosure is described by taking the bottom-gate thin-film transistor as an example.

Figure 3:
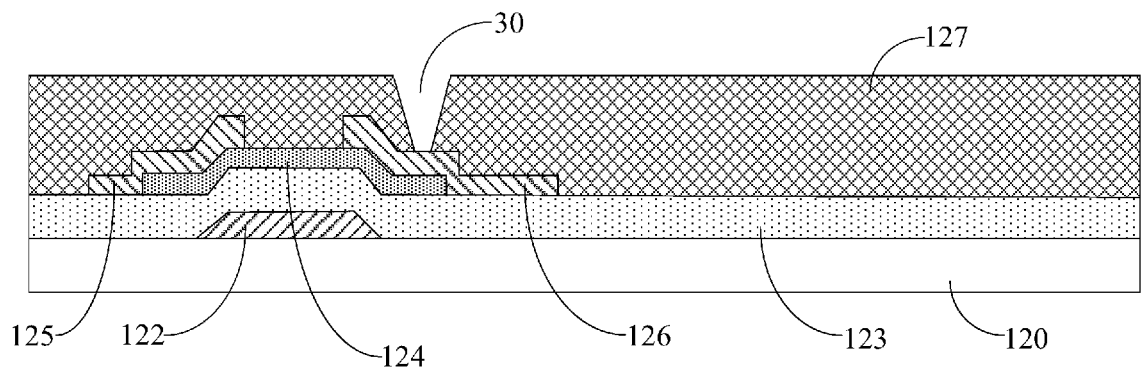
FIGS. 3-6 are schematic structural diagrams of different stages in the process of fabricating an array substrate in accordance with the embodiment of the disclosure.

As shown in FIG. 3, firstly a gate 122, a gate insulating layer 123, a semiconductor active layer 124, a source 125, a drain 126 and a passivation layer 127 are fabricated successively on a base substrate 120 by patterning processes. Specifically, a via hole 30 penetrating through the passivation layer 127 and exposing the drain 126 is formed by the patterning process. The specific fabrication methods of the gate 122, the gate insulating layer 123, the semiconductor active layer 124, the source 125, the drain 126 and the passivation layer 127 in the specific embodiment of the disclosure are similar to those of the prior art, which will not be described again herein.

Figure 4:
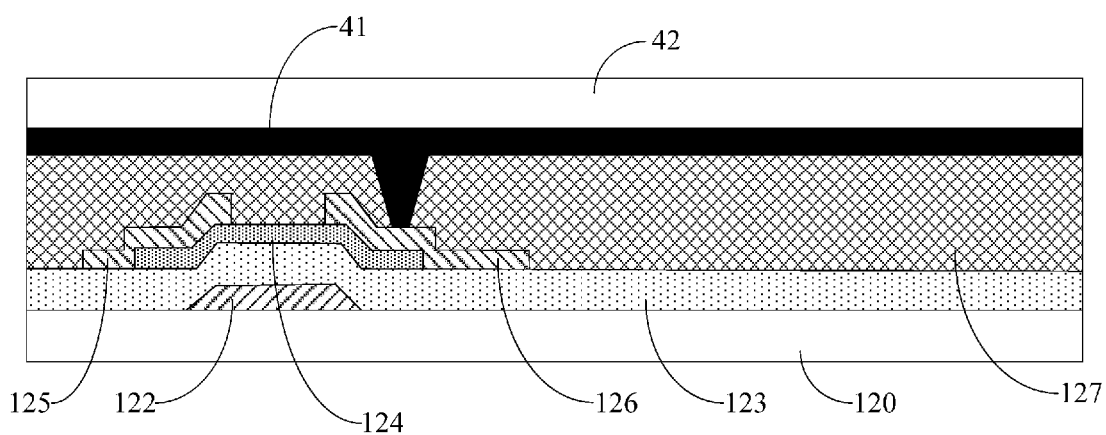

Then, as shown in FIG. 4, a metal layer 41 and a transparent conduction layer 42 are deposited successively on the passivation layer 127 by magnetron sputtering. The metal layer 41 is electrically connected to the drain 126 through the via hole 30 penetrating through the passivation layer 127. Indium tin oxide (ITO) is taken as an example of the transparent conduction layer 42 deposited in the embodiment of the disclosure.

Figure 5:
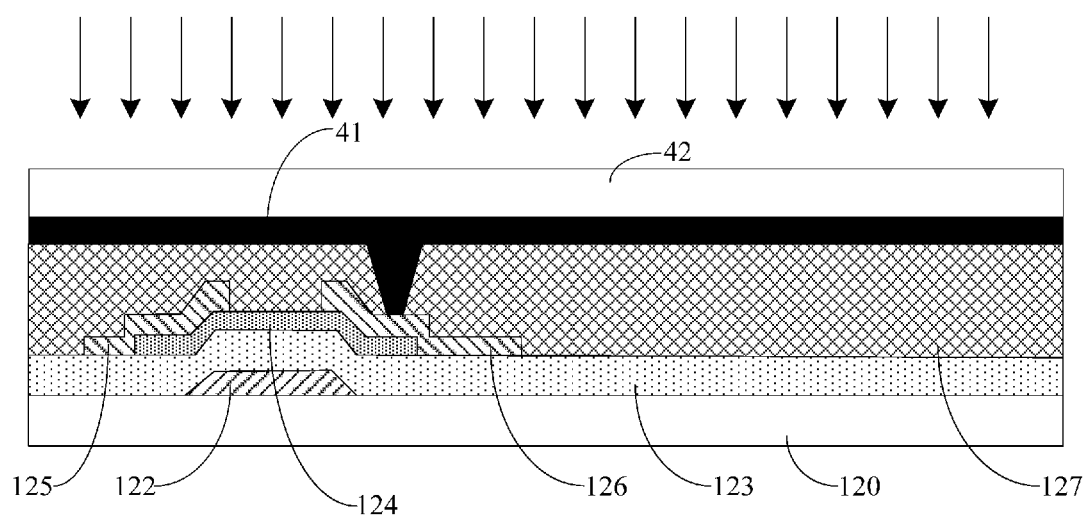
Figure 6:
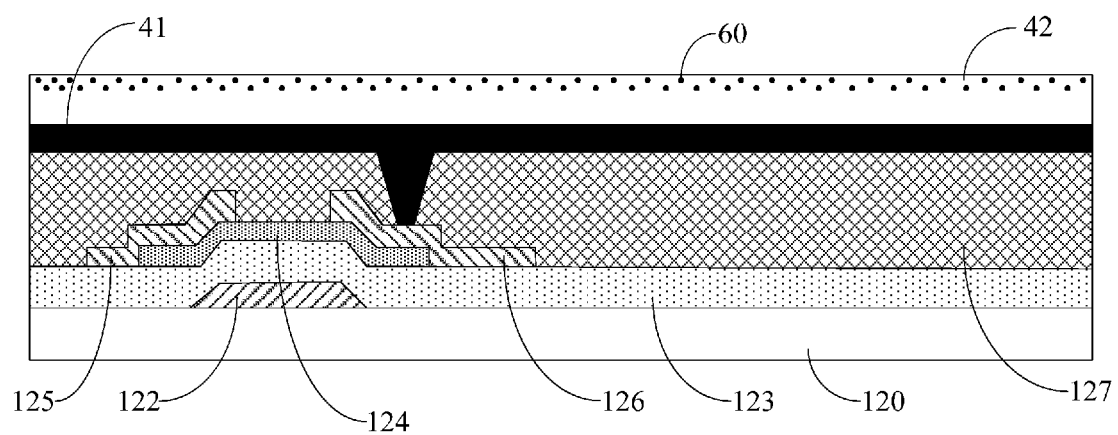

Then, as shown in FIG. 5, the base substrate on which the above steps have been completed is placed in a plasma-enhanced chemical vapor deposition (PECVD) apparatus, and plasma processing is performed on the formed transparent conduction layer 42 (i.e. ITO layer) with hydrogen as the working gas. The arrow direction in the figure indicates the processing direction of the plasma. Since the plasma with hydrogen as the working gas has strong reducibility, the metal ions contained in the ITO layer can be reduced, accordingly a large number of metallic particles 60 are separated out from the ITO layer. As shown in FIG. 6, the metallic particles 60 form a metallic particle layer.

The density of the metallic particles 60 in the metallic particle layer and the thickness of the metallic particle layer in the embodiment of the disclosure can be determined by parameters of the PECVD apparatus, for instance, the density of plasma in the chamber can be increased by increasing the flow rate of the working gas such as hydrogen and increasing the power of an upper electrode in the PECVD apparatus, thereby increasing the density of the metallic particles 60, and accordingly increasing the thickness of the metallic particle layer formed by the metallic particles 60.

In the actual production process, in order to reduce the damage of plasma bombardment to the ITO layer, the power of a lower electrode in the PECVD apparatus should be minimized to decrease the self-bias; the manner of treating the ITO by plasma in the PECVD apparatus is only a preferred embodiment in the embodiments of the disclosure, and any manner can also be employed in the actual production process as long as metal ions in the ITO layer can be reduced.

In addition, the working gas selected in the embodiment of the disclosure is hydrogen, which is only a preferred embodiment in the embodiments of the disclosure. Other reducing gases, such as $Cl_2$, $CO$, $H_2S$, $HBr$, $CH_4$, $SO_2$, etc., can also be used as the working gas of the specific embodiment of the disclosure, all of which have strong reducibility after being ionized into plasma.

The principle of forming metallic particles after performing plasma processing on the ITO layer in the specific embodiment of the disclosure is briefly described below.

Generally, an ITO thin film is a stannum (Sn) doped indium oxide ($In_2O_3$) thin film. The Sn atoms in the ITO thin film are generally present in the form of $SnO$ or $Sn_2O$. The surface of the ITO thin film is analyzed by using the secondary ion mass spectrometry (SIMS), and it is concluded that anion $O^-$ and cation $In^+$ on the surface of ITO thin film are its main components. $H_2$ is introduced into the chamber of the PECVD apparatus and the hydrogen ($H^{3O}$) ions are formed after ionization. Since the $H^+$ ion is more active than $In^+$ ion in the ITO thin film, so the $In^+$ ion can be displaced from the ITO thin film. The $In^+$ ion is deposited on the surface of the ITO thin film to gradually form In metallic simple substances, that is, to form the In metallic particles. The specific structure of In metallic simple substance is hemispherical or semi-ellipsoidal in shape. The reaction equation of hydrogen plasma and indium oxide is as follows:

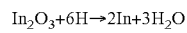

$$In_2O_3 + 6H \rightarrow 2In + 3H_2O$$

Generally, the larger the input flow rate of $H_2$ and the higher the concentration of $H_2$ are, the bigger the shape of the structure of the In metallic simple substance is and the more the number of the In metallic simple substances are. Therefore the parameters of the PECVD apparatus can be set according to the required scattering effect to obtain the In metallic simple substances with the proper size and the proper number.

In an implementation, $H_2$ is input into the chamber of the PECVD apparatus. By adjusting the concentration of the input amount of $H_2$ (e.g. 500 sccm-2,000 sccm) and the input time (e.g. 5 s-200 s), and by controlling such process parameters as the chamber pressure intensity (e.g. 500 Pa-3,000 Pa) and the temperature (e.g. 150-400° C.) of the PECVD apparatus, the In metallic simple substances are generated on the upper surface of the ITO thin film, and accordingly the structure size, shape and thickness of the In metallic simple substances can be adjusted.

Finally, the metal layer 41 and the transparent conduction layer 42 with the metallic particles 60 are simultaneously patterned by a mask process in the embodiment of the disclosure. The metal layer 41 and the transparent conduction layer 42 are etched together to form a pixel electrode of the array substrate. The lower part of the pixel electrode is the metal layer 41 for reflecting external light; the upper part of the pixel electrode is the transparent conduction layer 42 with a plurality of metallic particles 60 being distributed therein; and the metallic particle layer formed by the plurality of metallic particles 60 serves as the light scattering layer.

In the embodiments of the disclosure, after pixel electrode layer of the array substrate is fabricated, the transparent conduction layer at the top and the reflecting metal layer at the bottom in the pixel electrode layer is processed by the plasma in a working environment of reducing gas, to separate out the metallic particle layer from the transparent conduction layer at the top. In this way, a metallic particle layer is fabricated on the reflecting metal layer at the bottom to achieve a diffuse reflection effect without an additional photolithographic process, which not only improves the display effect, but also reduces the cost effectively.

Based on the same inventive concept, the embodiment of the disclosure further provides an array substrate fabricated by the above methods. The array substrate includes the thin-film transistor and the passivation layer successively arranged on a base substrate, and further includes the reflection layer located on the passivation layer and the transparent conduction layer located on the reflection layer, and the transparent conduction layer includes the metallic particle layer formed by a plurality of metallic particles. The metallic particle layer has a great diffuse reflection effect on the light irradiated to the transparent conduction layer, and therefore, the embodiment of the disclosure enables the viewer to see a uniform reflecting effect at all angles of view.

Optionally, the thickness of the metallic particle layer in the embodiment of the disclosure is 1/10-1/5 of the thickness of the transparent conduction layer, and the metallic particle layer of such thickness cannot only play a good role in diffuse reflection, but also does not affect the light reflecting property of the reflection layer.

Figure 7:
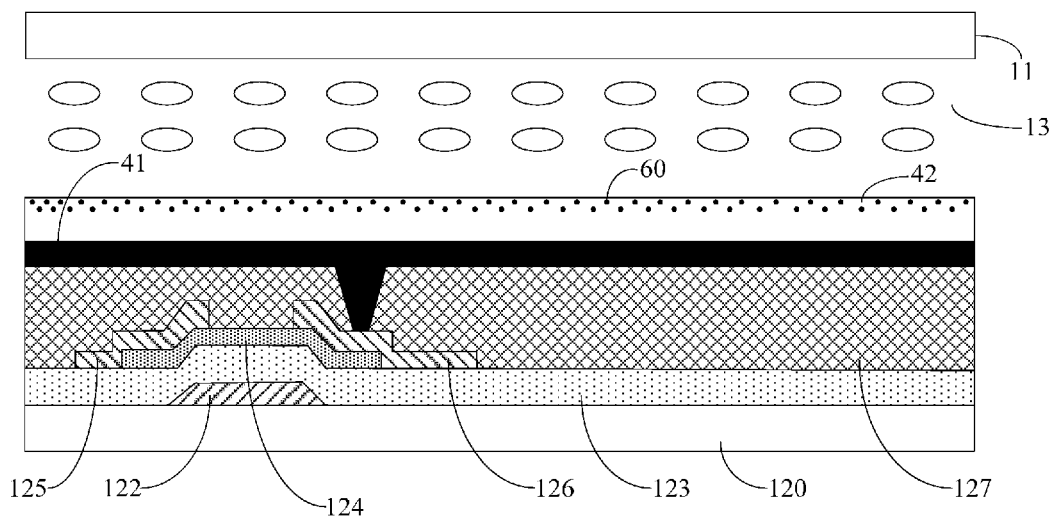
FIG. 7 is a schematic structural diagram of a display panel in accordance with the embodiment of the disclosure.

Based on the same inventive concept, the embodiment of the disclosure further provides a display panel. The display panel includes the array substrate according to the above embodiments of the disclosure. As shown in FIG. 7, the display panel includes an opposite substrate 11 arranged opposite to the above array substrate according to the embodiment of the disclosure, and a liquid crystal layer 13 located between the array substrate and the opposite substrate 11. The structure of the opposite substrate 11 is the same as that of the prior art, which will not be described again herein.

Figure 8:
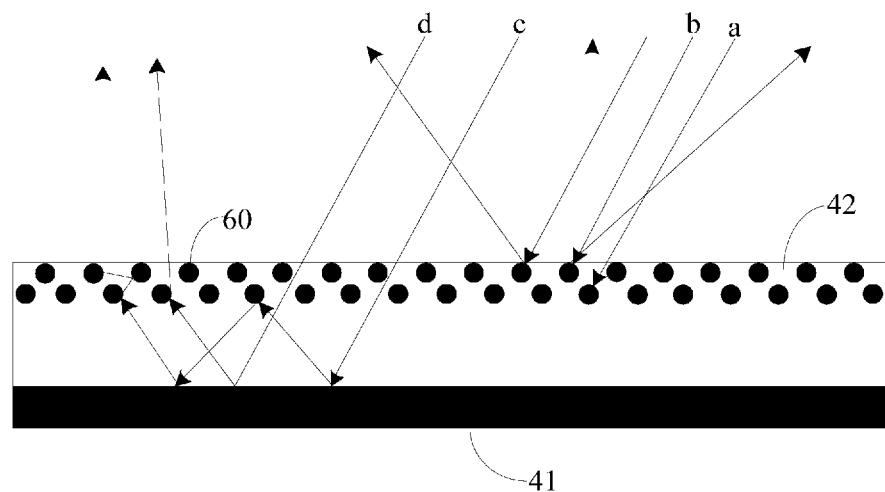
FIG. 8 is a schematic diagram of scattering of external light by a pixel electrode included in an array substrate in accordance with the embodiment of the disclosure.

As shown in FIG. 7 and FIG. 8, a part of the light a, b, c, d passing through the opposite substrate 11 is directly reflected back by the metallic particles 60 on the surface of the transparent conduction layer 42, and another part of the light is scattered by the metallic particles 60 and then irradiated to the metal layer 41. After being reflected by the metal layer 41, the light is irradiated to the liquid crystal layer 13 through a light-transmitting region between the metallic particles 60, or the light reflected by the metal layer 41 passes through the metallic particles 60 again and are scattered by the metallic particles 60 and then irradiated to the liquid crystal layer 13. There are many kinds of light paths for reflecting light, which passes through the opposite substrate, back to the liquid crystal layer by the array substrate, which will not be listed here one by one. In the embodiment of the disclosure, the external light passing through the opposite substrate is sufficiently scattered by metallic particles 60, thereby increasing the display uniformity of the reflective display panel and improving the display quality.

Based on the same inventive concept, the embodiment of the disclosure further provides a display device. The display device includes the display panel according to the above embodiments of the disclosure, and the display device may be any product or component with a display function such as a mobile phone, a tablet computer, a liquid crystal television, an organic light-emitting diode (OLED) television, a laptop, a digital photo frame, a navigator, etc. Other essential components of the display device should be understood by those ordinary skilled in the art, which will not be described again herein.

In summary, the embodiments of the disclosure provides a fabrication method of an array substrate, including forming a reflection layer and a transparent conduction layer successively on the passivation layer, wherein the reflection layer is electrically connected to the source or drain of the thin-film transistor through a via hole penetrating through the passivation layer, and the transparent conduction layer contains a plurality of metal ions; performing reduction process on the transparent conduction layer to enable the metal ions to be reduced to form a metallic particle layer; and patterning the transparent conduction layer and the reflection layer on which the above steps have been completed to form a pixel electrode. The reflection layer formed in the embodiment of the disclosure plays a good role in reflecting external lights, and at the same time, the metallic particle layer formed in the embodiment of the disclosure has an excellent diffuse reflection effect on the light irradiated to the transparent conduction layer. Accordingly, the embodiment of the disclosure enables the viewer to see a uniform reflecting effect at all angles of view, and improves the display effect compared with the prior art.

It is obvious to those skilled in the art that various modifications and variations may be made to the disclosure without departing from the spirit and scope of the disclosure. Thus, if these modifications and variations of the disclosure fall within the scope of the claims of the disclosure and their equivalents, it is also intended that these modifications and variations be covered by the disclosure.

The invention claimed is:

1. A fabrication method of an array substrate, comprising a method of fabricating a thin-film transistor and a passivation layer successively on a base substrate, wherein the fabrication method further comprises:
   forming a reflection layer and a transparent conduction layer successively on the passivation layer, wherein the reflection layer is electrically connected to a source or drain of the thin-film transistor through a via hole penetrating through the passivation layer, and the transparent conduction layer contains a plurality of metal ions;
   performing a plasma processing on the transparent conduction layer through a plasma-enhanced chemical vapor deposition apparatus in a working environment of reducing gas, to enable the metal ions contained in the transparent conduction layer to be reduced to form a metallic particle layer; wherein a thickness of the metallic particle layer is $1/10$-$1/5$ of a thickness of the transparent conduction layer; and
   patterning the transparent conduction layer with the metallic particle layer and the reflection layer to form a pixel electrode;
   wherein during performing the plasma processing on the transparent conduction layer through the plasma-enhanced chemical vapor deposition apparatus, a power of a lower electrode in the plasma-enhanced chemical vapor deposition apparatus is less than a power of an upper electrode in the plasma-enhanced chemical vapor deposition apparatus, the lower electrode is a ground electrode, and the upper electrode is a high frequency electrode for discharge.

2. The fabrication method according to claim 1, wherein the reducing gas is any one of hydrogen, chlorine, carbon monoxide, hydrogen sulfide, hydrogen bromide, methane and sulfur dioxide.

3. The fabrication method according to claim 1, wherein the step of forming the reflection layer and a transparent conduction layer successively on the passivation layer comprises:
   depositing a metal layer and a transparent conduction layer successively on the passivation layer by magnetron sputtering.

4. The fabrication method according to claim 3, wherein the transparent conduction layer is any one or any combination of indium tin oxide, indium zinc oxide and zinc oxide.

* * * * *